United States Patent
Fujita et al.

(10) Patent No.: US 6,825,508 B2
(45) Date of Patent: Nov. 30, 2004

(54) HETEROJUNCTION BIPOLAR TRANSISTOR AND PRODUCTION PROCESS THEREFOR

(75) Inventors: Koichiro Fujita, Tenri (JP); Katsuhiko Kishimoto, Nara (JP); Masaharu Yamashita, Tenri (JP)

(73) Assignee: Sharp Kabushiki Kaisha, Osaka (JP)

( * ) Notice: Subject to any disclaimer, the term of this patent is extended or adjusted under 35 U.S.C. 154(b) by 1 day.

(21) Appl. No.: 10/238,742

(22) Filed: Sep. 11, 2002

(65) Prior Publication Data

US 2003/0047753 A1 Mar. 13, 2003

(30) Foreign Application Priority Data

Sep. 11, 2001 (JP) ........................................ 2001-275418
Jun. 10, 2002 (JP) ........................................ 2002-168828

(51) Int. Cl.$^7$ ..................... H01L 3/072; H01L 31/0328
(52) U.S. Cl. ...................................... 257/197; 257/565
(58) Field of Search ................................. 257/197, 565

(56) References Cited

U.S. PATENT DOCUMENTS

| | | | |
|---|---|---|---|
| 6,221,783 B1 * | 4/2001 | Park et al. .................. | 438/712 |
| 6,278,054 B1 * | 8/2001 | Ho et al. .................... | 136/256 |
| 6,376,867 B1 * | 4/2002 | Gutierrez-Aitken et al. | 257/197 |
| 6,593,604 B2 | 7/2003 | Ishimaru | |

FOREIGN PATENT DOCUMENTS

| | | |
|---|---|---|
| JP | 2-292830 A | 12/1990 |
| JP | 3-10839 | 1/1991 |
| JP | 7-273126 A | 10/1995 |
| JP | 8-64610 | 3/1996 |
| JP | 9-246280 | 9/1997 |
| JP | 2000-156382 A | 6/2000 |
| JP | 2001-217255 A | 8/2001 |

OTHER PUBLICATIONS

Liu et al, GaAs IC Symposium, pp. 167–170 (1995).
Asbeck et al., "Heterojunction Bipolar Transistors for Microwave and Millimeter–wave Integrated Circuits," Dec. 1987, pp. 2571–2577, IEEE Transactions on Electron Devices, vol. ED–34, No. 12.

* cited by examiner

*Primary Examiner*—Alexander Ghyka
(74) *Attorney, Agent, or Firm*—Birch, Stewart, Kolasch & Birch, LLP

(57) ABSTRACT

A heterojunction bipolar transistor comprising a collector layer of a first conductivity type, a base layer of a second conductivity type, and an emitter layer of the first conductivity type, which are formed on a semiconductor substrate in this order, and further a collector electrode directly or indirectly connected to the collector layer, a base electrode directly or indirectly connected to the base layer, and an emitter electrode directly or indirectly connected to the emitter layer, wherein a semiconductor protecting layer is formed on the base layer and extended outside an edge of the base layer, the base electrode is formed on the semiconductor protecting layer, and at least a region under the semiconductor protecting layer is filled with an organic insulator.

9 Claims, 8 Drawing Sheets

HETEROJUNCTION BIPOLAR TRANSISTOR AND PRODUCTION PROCESS THEREFOR

CROSS-REFERENCES TO RELATED APPLICATIONS

This application is related to Japanese Patent Applications Nos. 2001-275418 and 2002-168828, filed on Sep. 11, 2001 and Jun. 10, 2002 whose priorities are claimed under 35 USC §119, the disclosures of which are incorporated by reference in their entirety.

BACKGROUND OF THE INVENTION

1. Field of the Invention

The present invention relates to a heterojunction bipolar transistor. More particularly it relates to a heterojunction bipolar transistor serving as a semiconductor device for amplifying a high-frequency electric power such as a microwave band, a millimeter wave band and the like, and a production process therefor.

2. Description of Related Art

Heterojunction bipolar transistors (HBTs) which utilize heterojunction of compound semiconductors and use, for an emitter layer, a semiconductor whose forbidden band gap energy is larger than that of a base layer can provide a high current gain, because reverse injection of a minority carrier from the base layer to the emitter layer is suppressed and the injection efficiency of a carrier to the emitter layer improves. Also since the impurity concentration in the base layer can be raised to reduce the resistance of the base layer, the thickness of the base layer can be decreased to shorten transit time for the carrier to pass through the base layer. Thereby high-frequency characteristics can be improved.

With development of mobile communication equipment including mobile phones, there is a demand for higher-power, higher-efficient high-frequency amplifier devices, and the HBTs are greatly expected.

As other various devices, to reduce parasitic resistance and parasitic capacitance is a basic technique for improving characteristics of the HBTs. Criteria indicating the high-frequency characteristics of the HBTs include a cut-off frequency fT and a maximum oscillated frequency $f_{max}$, which are represented by the following formula:

$$f_{max} = (fT/8\pi RbCc)^{1/2} \quad (1)$$

wherein, Rb is a base resistance and Cc is a collector capacitance. If fT is constant, $f_{max}$ can be increased by reducing the collector capacitance Cc. The collector capacitance Cc is represented by the sum of an intrinsic collector capacitance Ci and a parasitic collector capacitance Cex as shown by the following formula:

$$Cc = Ci + Cex \quad (2).$$

The intrinsic collector capacitance Ci is determined by the structure of a semiconductor layer, while the parasitic collector capacitance Cex is determined by the configuration of a device. Therefore, the collector capacitance Cc can be reduced by a production process of the configuration.

In order to reduce the parasitic collector capacitance, IEEE Trans. Electron Devices ED34 pp. 2571–2577 proposes a technique of depleting an external collector layer by implanting hydrogen or oxygen ions into the external collector layer under an external base electrode. However, by this method, the base resistance Rb increases due to damage to the base layer caused by ion implantation, and as a result, it is difficult to improve $f_{max}$.

Other methods of etching away a collector layer under an external base layer in a lateral direction are disclosed in Japanese Unexamined Patent Publications Nos. HEI 3(1991)-10839, HEI 8(1996)-64610 and HEI 9(1997)-246280, and GaAs IC Symposium 1995 Tech. Digest pp. 160–170.

By the methods, the parasitic collector capacitance can be reduced since a void is formed under the external base layer.

However, the above-mentioned methods have the effect of reducing the parasitic capacitance, but on the other hand, the yield in a process for forming the base electrode and a lead electrode therefor is poor and the reliability of devices is questionable.

SUMMARY OF THE INVENTION

The present invention is to solve the above-described problems of the prior art, and an object thereof is to provide a reliable heterojunction bipolar transistor with a reduced parasitic collector capacitance which can be produced in a good yield, and a process for producing the heterojunction bipolar transistor.

The present invention provides a heterojunction bipolar transistor comprising
 a collector layer of a first conductivity type,
 a base layer of a second conductivity type, and
 an emitter layer of the first conductivity type, which are formed on a semiconductor substrate in this order, and further
 a collector electrode directly or indirectly connected to the collector layer,
 a base electrode directly or indirectly connected to the base layer, and
 an emitter electrode directly or indirectly connected to the emitter layer,
 wherein a semiconductor protecting layer is formed on the base layer and extended outside an edge of the base layer,
 the base electrode is formed on the semiconductor protecting layer, and
 at least a region under the semiconductor protecting layer is filled with an organic insulator.

The present invention also provides a process for producing a heterojunction bipolar transistor comprising the steps of:
 forming at least a collector layer, a base layer, a semiconductor protecting layer and an emitter layer on a semiconductor substrate in this order;
 carrying out an emitter mesa etching to etch away a part of the emitter layer to the surface of the semiconductor protecting layer;
 masking the emitter layer and a part of the semiconductor protecting layer, etching away an unmasked part of the semiconductor protecting layer, and continuously etching the base layer and the collector layer so that the area of the base layer and the collector layer becomes smaller than the resulting semiconductor protecting layer; and
 applying a polyimide precursor having a positive-type photosensitivity onto the resulting semiconductor substrate, patterning and thermally treating the polyimide precursor, thereby forming an organic insulator so as to fill at least a region under the semiconductor protecting layer.

The present invention further provides a process for producing a heterojunction bipolar transistor comprising the steps of:

forming a sub-collector, an etching stopper layer, a collector layer, a base layer, a semiconductor protecting layer and an emitter layer on a semiconductor substrate in this order;

carrying out an emitter mesa etching to etch away a part of the emitter layer to the surface of the semiconductor protecting layer;

masking the emitter layer and a part of the semiconductor protecting layer, etching away an unmasked part of the semiconductor protecting layer, and continuously etching the base layer and the collector layer to the etching stopper layer so that the area of the base layer and the collector layer becomes smaller than the resulting semiconductor protecting layer and forming a mask to cover all the resulting semiconductor protecting layer and etching away an unmasked region of the etching stopper layer.

These and other objects of the present application will become more readily apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

DESCRIPTION OF THE PREFERRED EMBODIMENTS

Figure 1:
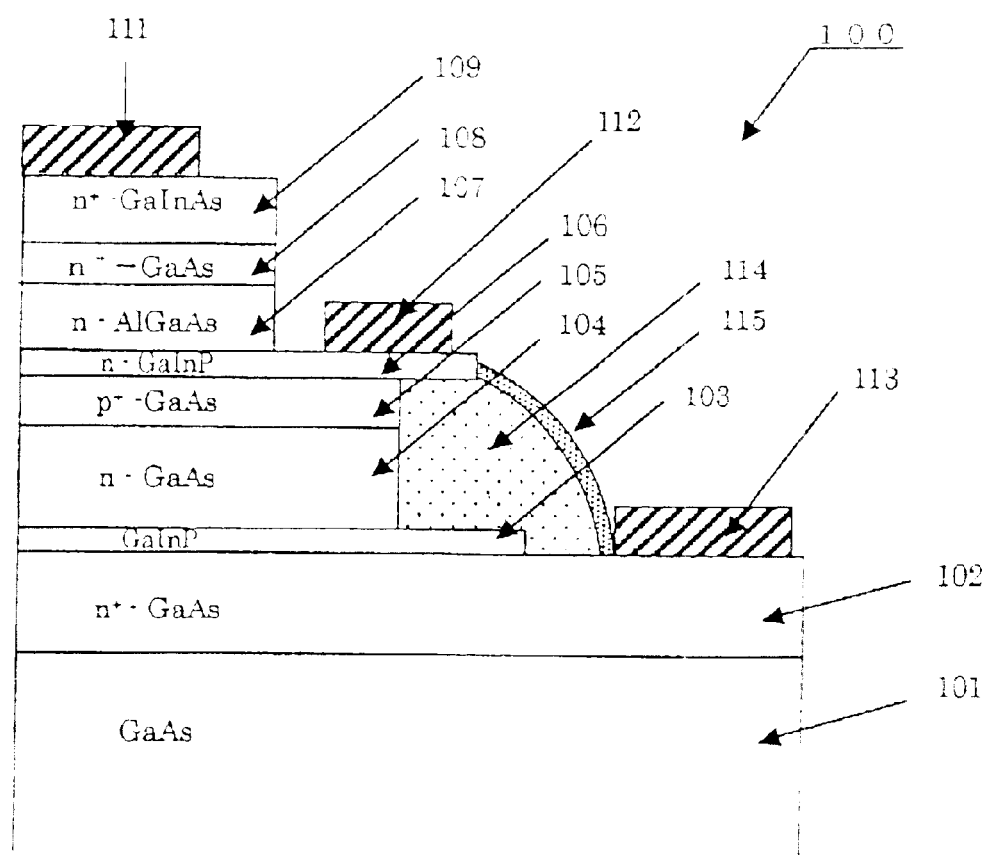
FIG. 1 is a schematic sectional view of a major part of a heterojunction bipolar transistor in accordance with an example of the present invention.

The heterojunction bipolar transistor of the present invention is constructed mainly of a semiconductor substrate, a collector layer of a first conductivity type, a base layer of a second conductivity type and an emitter layer of a first conductivity type, which are formed in this order.

Any semiconductor substrate usable for transistors in the field of art can be used as the semiconductor substrate without any particular limitation, and examples thereof include substrates of compound semiconductors such as GaAs, AlGaAs, InGaP, InGaAlP, InGaAs, InP, InGaAsP, GaN, InGaN, $Al_2O_3$ and the like, elementary semiconductors and the like, among which a substrate of GaAs is preferred.

The collector layer of the first conductivity type, the base layer of the second conductivity type and the emitter layer of the first conductivity type may be formed by selecting materials from the above-mentioned compound semiconductors and elementary semiconductors, more particularly, AlGaAs-base materials, InGaAlP-base materials, InGaAsP-base materials, InGaN-base materials and the like. Each of the layers may be formed in a single layer or a plurality of laminate layers using the above mentioned materials whose composition ratio is adjusted, or may be formed by combining a plurality of layers of different materials. Particularly, the collector layer and the base layer may preferably be formed of GaAs and the emitter layer may preferably be formed of GaAs or AlGaAs. The first conductivity type means p-type or n-type, and the second conductive means n-type or p-type. The impurity concentration in each layer may be selected as appropriate depending upon desired characteristics of the transistor, material and thickness of each layer and the like.

A semiconductor protecting layer of the first conductivity type is formed on the base layer, the semiconductor protecting layer extending outside the edge of the base layer. Extending outside the edge of the base layer means that the semiconductor protecting layer is formed to project into a region where the base layer does not exist. For example, the semiconductor protecting layer preferably has a size such that it covers the entire base layer and further extends outside the base layer. So long as the semiconductor protecting layer has at least a portion extending outside the edge of the base layer, it may cover only a part of the base layer. The size of the semiconductor protecting layer is preferably set such that an emitter layer and other layers to be formed on the semiconductor protecting layer have a sufficient contact area with the base layer with intervention of the semiconductor protecting layer and a base electrode is ensured to have a sufficient contact area to the semiconductor protecting layer for avoiding short circuit. The semiconductor protecting layer may be formed by selecting an appropriate material from the above-mentioned semiconductor materials in consideration of materials for the base layer and the emitter layer which are formed on the upside and the downside of the semiconductor protecting layer. Particularly, if the collector layer and the base layer are formed of GaAs and the emitter layer is formed of GaAs or AlGaAs, the semiconductor protecting layer preferably is formed of GaInP, AlGaAs or the like. The thickness of the semiconductor protecting layer is not particularly limited and is set as appropriate depending upon the characteristics of the transistor to be obtained, the concentration of an impurity of the first conductivity type, the material for the semiconductor protecting layer, mechanical strength during production and the like. For example, the semiconductor protecting layer is suitably 20 nm to 50 nm thick.

The heterojunction bipolar transistor of the present invention is provided with a collector electrode, a base electrode and an emitter electrode. These electrodes may be formed of any conductive materials, and for example, they may be formed in a single-layer or multilayer film of a single element, alloy, oxide or the like of a metal such as Al, Cu, Pt, Au, Ge, Ni or the like, or a refractory metal such as Ti, Ta, W or the like. As for these electrodes, basically, the collector electrode is formed on the collector layer, the base electrode is formed on the base layer and the emitter electrode is formed on the emitter layer. However, the electrodes are not necessarily formed immediately on these layers, but may be formed with intervention of an intermediate layer, a protecting layer, a buffer layer or the like. The electrodes may be partially extended outside the layers. Particularly, the base electrode is formed on the semiconductor protecting layer, and preferably it is formed above the base layer to extend outside the edge of the base layer. Thereby, as discussed above, the emitter layer and the like formed on the semiconductor protecting layer can have a sufficient contact area with the base layer with intervention of the semiconductor protecting layer, and the base electrode can be formed on the semiconductor protecting layer with a sufficient contact area for preventing the short-circuit of the base electrode.

Further, in the heterojunction bipolar transistor of the present invention, at least a region under the semiconductor protecting layer is filled with an organic insulator. That is, since the semiconductor protecting layer extends outside the edge of the base layer, it has an overhang over the base layer. At least under the overhang of the semiconductor protecting layer, the organic insulator is buried. Particularly, the organic insulator is buried in a space on sides of the base layer and the collector layer under the semiconductor protecting layer so that it covers, preferably completely covers, the bottom face of the semiconductor protecting layer and the side faces of the base layer and the collector layer. So long as electrical connection with the electrodes is ensured, the part of the transistor located under the semiconductor protecting layer may be covered with the organic insulator, and further the side and top faces of the semiconductor protecting layer, that is, substantially all the heterojunction bipolar transistor may be covered with the organic insulator. The organic insulator may be any material that can prevent physical damage to the overhang of the semiconductor protecting layer and can protect the side faces of the base layer and the collector layer, and preferably the material has positive-type photosensitivity. More particularly, a polyimide resin, an acrylic resin, an epoxy resin and the like may be mentioned, among which the polyimide resin is preferred. Further, the surface of the organic insulator is preferably covered with an inorganic insulating film. As inorganic insulators, may be used all materials that are usually used as insulators in the field of art such as a silicon nitride film, a silicon oxide film and the like. The thickness of the inorganic insulator may be about 50 nm to 200 nm, for example.

In addition to the semiconductor substrate, the electrodes, the collector layer of the first conductivity type, the base layer of the second conductivity type, the emitter layer of the first conductivity type and the semiconductor protecting layer, the heterojunction bipolar transistor of the present invention may be provided, at any position between the above layers, with an etching stopper layer, an intermediate layer, a buffer layer, a cap layer, a flattening layer, a protective layer and the like singly or in combination. Particularly, between the semiconductor substrate and the collector layer, a sub-collector layer may be formed which has a higher carrier concentration and a larger area than the collector layer. The material for the sub-collector layer may be selected as appropriate from the above mentioned materials, and particularly, the sub-collector layer is preferably formed of the same material as the semiconductor substrate. In this case, the difference in the carrier concentration is suitably about $10^2$ cm$^{-3}$. Preferably, the sub-collector layer has a sufficient size so that the collector layer and the collector electrode can have good junction/contact on the sub-collector layer.

Between the collector layer and the sub-collector layer, an etching stopper layer may be formed which has an area larger than the collector layer but smaller than the sub-collector layer. The etching stopper layer is preferably formed of such a material in such a thickness that, when the collector layer is patterned by etching, the etching stopper layer can stop etching without damage to the sub-collector layer by the etching. For example, the material can be selected as appropriate from the above-mentioned semiconductor materials.

According to the heterojunction bipolar transistor of the present invention, the sub-collector layer, the etching stopper layer, the collector layer, the base layer, the semiconductor protecting layer and the emitter layer are formed on the semiconductor substrate in this order. These layers may be formed by various known methods including a metal-organic vapor phase epitaxy method (MOVPE method), a molecular beam epitaxy method (MBE method), a liquid-phase epitaxy method (LPE method), a sputtering method and the like.

Emitter mesa etching is conducted to remove the emitter layer from a region where the emitter layer (region) is not to be formed to the surface of the semiconductor protecting layer. The etching may be done by a dry etching method such as RIE or a wet etching method using acid, alkali or a mixture solution.

The emitter layer and a part of the semiconductor protecting layer are masked. It is necessary to cover all the emitter layer and a part of the semiconductor protecting layer where the base electrode is to be formed later with a mask. The mask can be formed by a known method, for example, by a photolithography and etching method. Using the mask, the semiconductor protecting layer is etched away using any of the above-mentioned etching methods.

Using the same mask, the base and the collector layer are etched using any etching method that can realize isotropic etching. By this etching, the base layer and the collector layer can be etched to the etching stopper layer so as to have a smaller area than the semiconductor protecting layer.

A mask may be formed to cover all the resulting semiconductor protecting layer after the etching. Preferably, the mask covers the resulting substrate to leave and expose a sufficient area of the sub-collector layer for forming the collector electrode on the sub-collector layer. Using this mask, an unmasked region of the etching stopper layer is etched away using any of the above etching methods. In the present invention, the etching stopper layer is not necessarily removed, but preferably it is removed because the etching stopper layer, if it remains, increases the contact resistance of the collector electrode a little.

According to the process for producing the heterojunction bipolar transistor of the present invention, the collector electrode may be further formed on the sub-collector layer. The electrode may be formed by forming a desired conductive film by a sputtering method, a vacuum evaporation method or the like, and then patterning the conductive film by a photolithography and etching method or by a lift-off method.

A polyimide precursor having a positive-type photosensitivity is applied to the resulting semiconductor substrate, patterned and thermally treated. The polyimide precursor can be applied by various methods including a spin-coating method. As discussed above, patterning here may be performed by any means so long as the organic insulator to be obtained later is filled in such a location that a part under the semiconductor protecting layer can be prevented from being physically damaged, preferably in such a location that the organic insulator can cover the side faces of the base layer and the collector layer completely. However, in order to ensure electrical connection to the collector electrode, the polyimide precursor is preferably patterned so that the collector electrode is not buried. For example, the positive-type photosensitive polyimide precursor can be patterned in a desired configuration by exposure and development. Thermal treatment is for imidizing, drying and densifying the polyimide precursor and may suitably be carried out in the atmosphere or in a nitrogen atmosphere at a temperature of about 250 to 350° C. for 30 to 120 minutes. Thereby, the organic insulator can be formed to fill at least under the semiconductor protecting layer. The polyimide precursor may be patterned to cover all the surface of the heterojunction bipolar transistor except that the collector electrode, the emitter electrode and/or the base electrode are partially exposed to ensure electrical connection to these electrodes.

In the heterojunction bipolar transistor of the present invention, at any time before, during or after the above-described process, production steps necessary for forming common transistors may be carried out. Such production steps include ion implantation, doping of an impurity, thermal treatment, formation and patterning of a protective film, an insulating film and a conductive film, and the like.

The heterojunction bipolar transistor and its production process of the present invention are now described in detail by way of example with reference to the drawings.

EXAMPLE 1

In a heterojunction bipolar transistor 100 according to the present invention, as shown in FIG. 1, a GaAs sub-collector layer 102 doped with Si in a high concentration for ohmic contact with a GaAs collector layer 104, a GaInP etching stopper layer 103 whose area is smaller than that of the sub-collector layer 102, the GaAs collector layer 104 whose area is smaller than that of the etching stopper layer 103 and a GaAs base layer 105 are formed sequentially on a semi-insulative GaAs substrate 101. On the base layer 105, a GaInP semiconductor protecting layer 106 whose area is larger than that of the base layer 105, an AlGaAs emitter layer 107 whose area is smaller than that of the semiconductor protecting layer 106, a GaAs first emitter contact layer 108 and a GaInAs second emitter contact layer 109 are sequentially formed.

A collector electrode 113 is formed on the sub-collector layer 102 where the surface of the sub-collector layer 102 is not covered with the etching stopper layer 103.

On the semiconductor protecting layer 106, is formed a base electrode 112 a part of which is extended outside the edge of the base layer 105.

On the second emitter contact layer 109, is formed an emitter electrode 111.

An organic insulator 114 of a polyimide resin is continuously formed on a bottom face of the semiconductor protecting layer 106 and on side faces of the base layer 105 and the collector layer 104, and the surface of the organic insulator 114 is covered with an inorganic insulating film 115 of silicon nitride (SiN).

Figure 2:
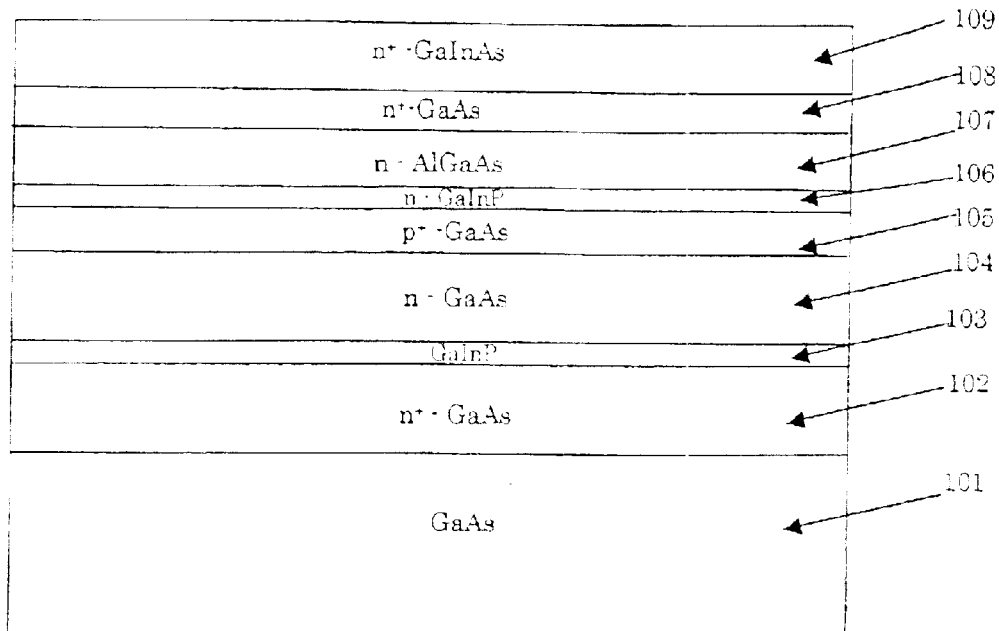
FIGS. 2(a) to 2(i) are schematic sectional views of the major part of the heterojunction bipolar transistor of FIG. 1, illustrating a process for producing the same.
Figure 2:
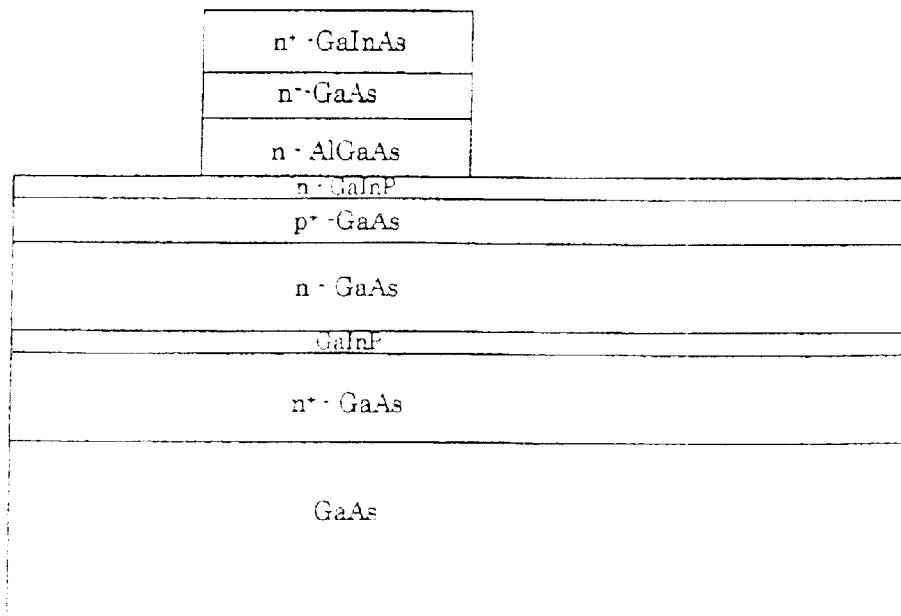
Figure 2:
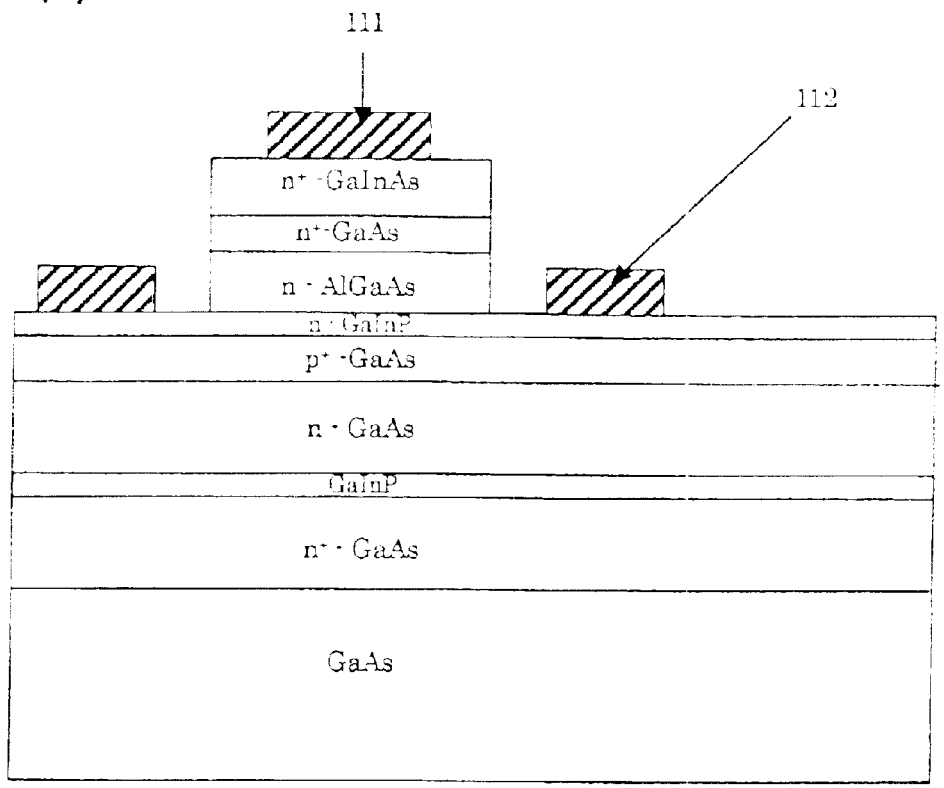
Figure 2:
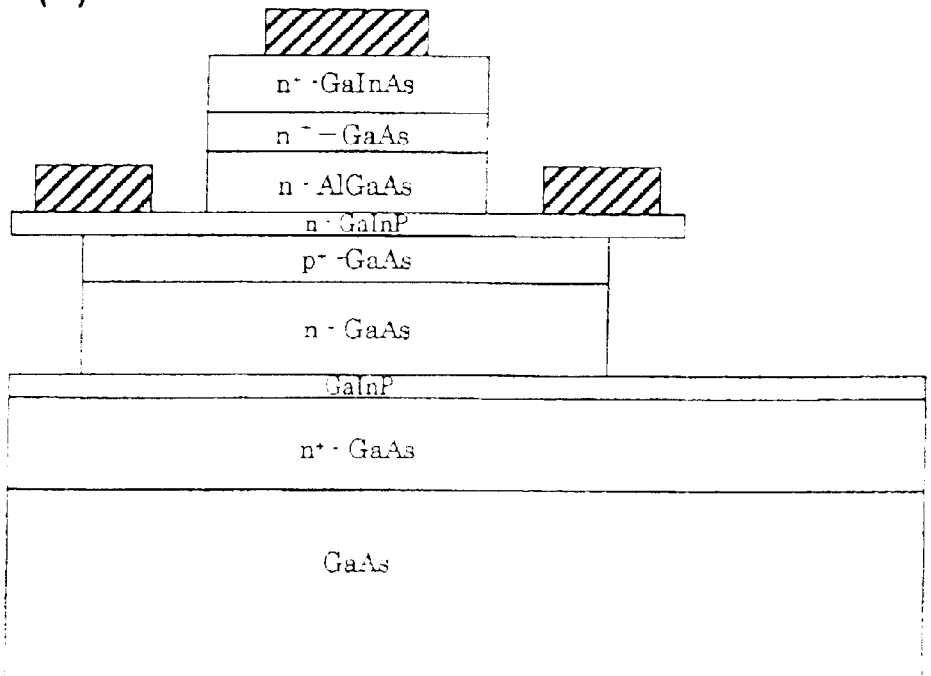
Figure 2:
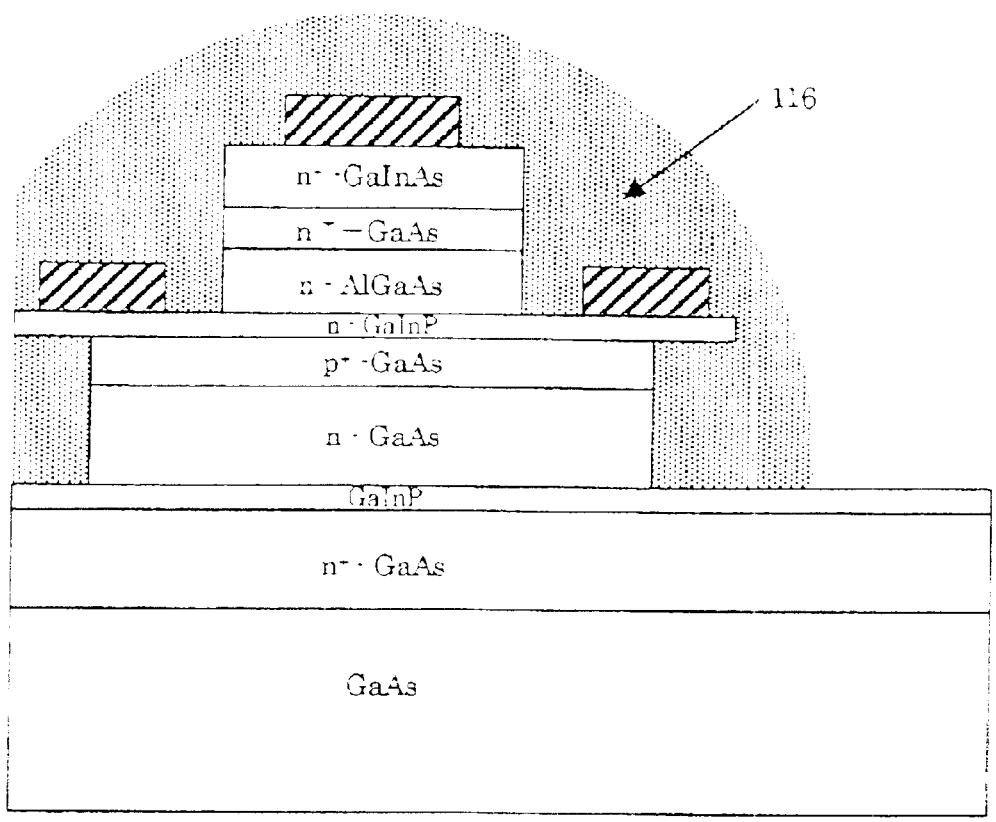
Figure 2:
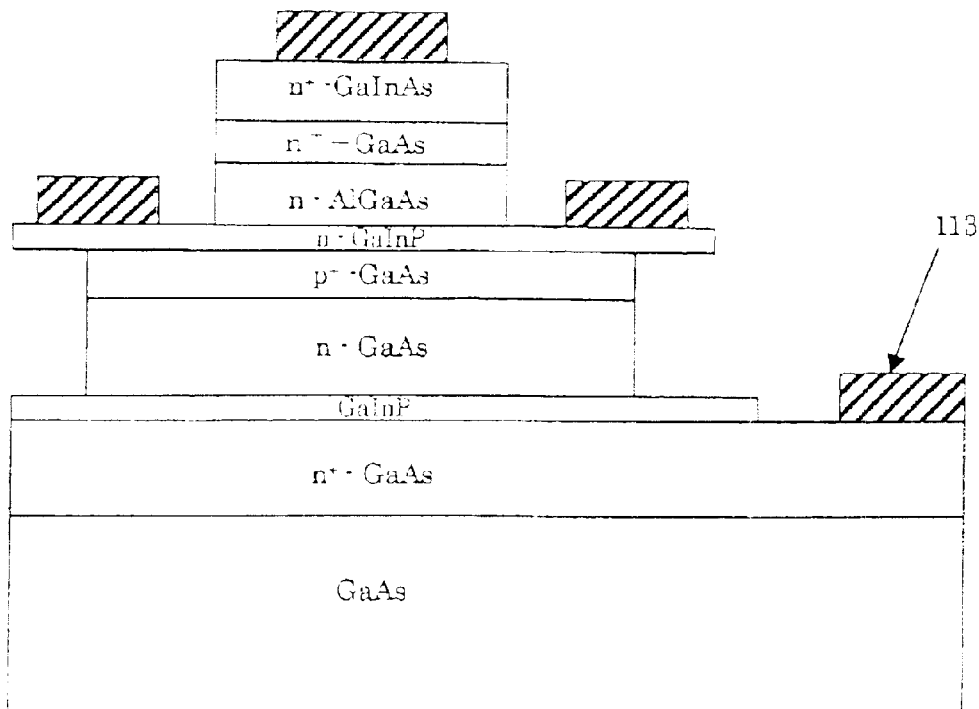
Figure 2:
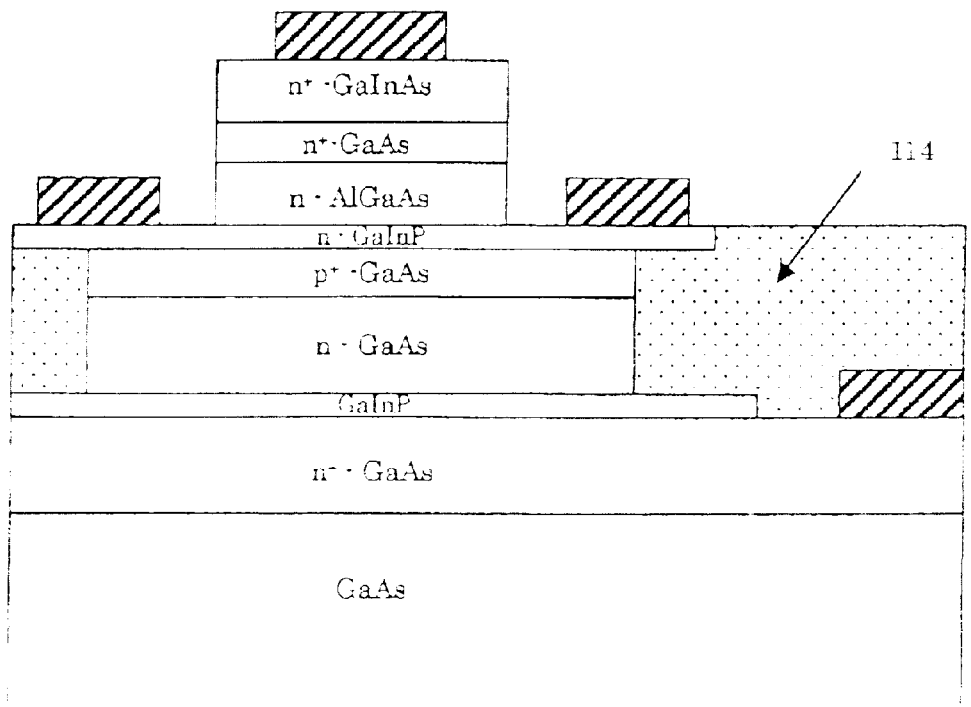
Figure 2:
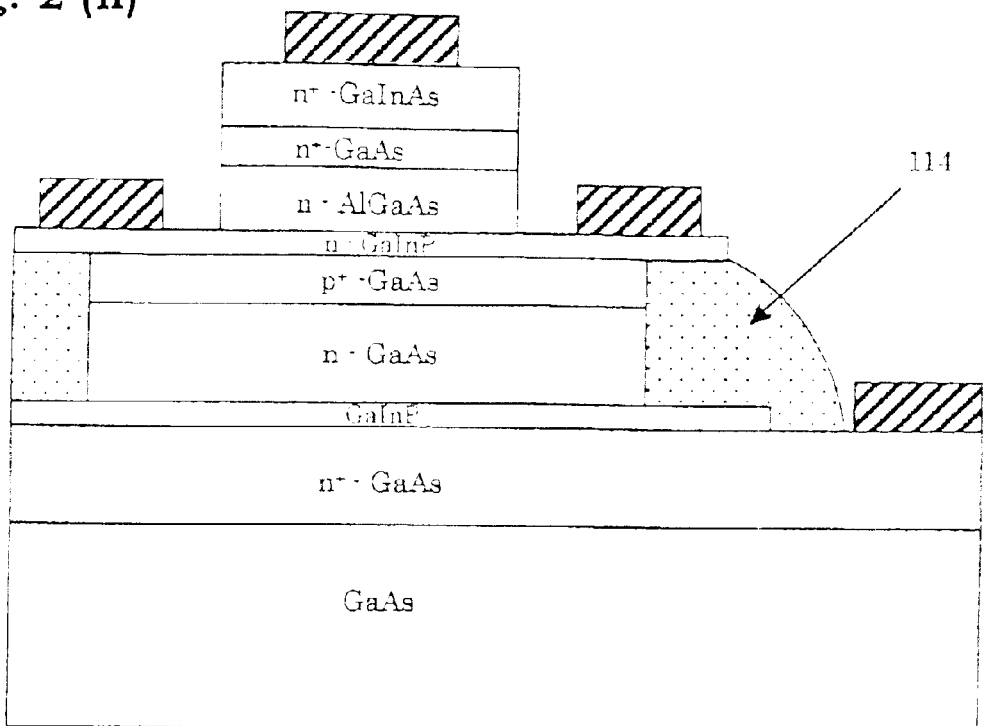
Figure 2:
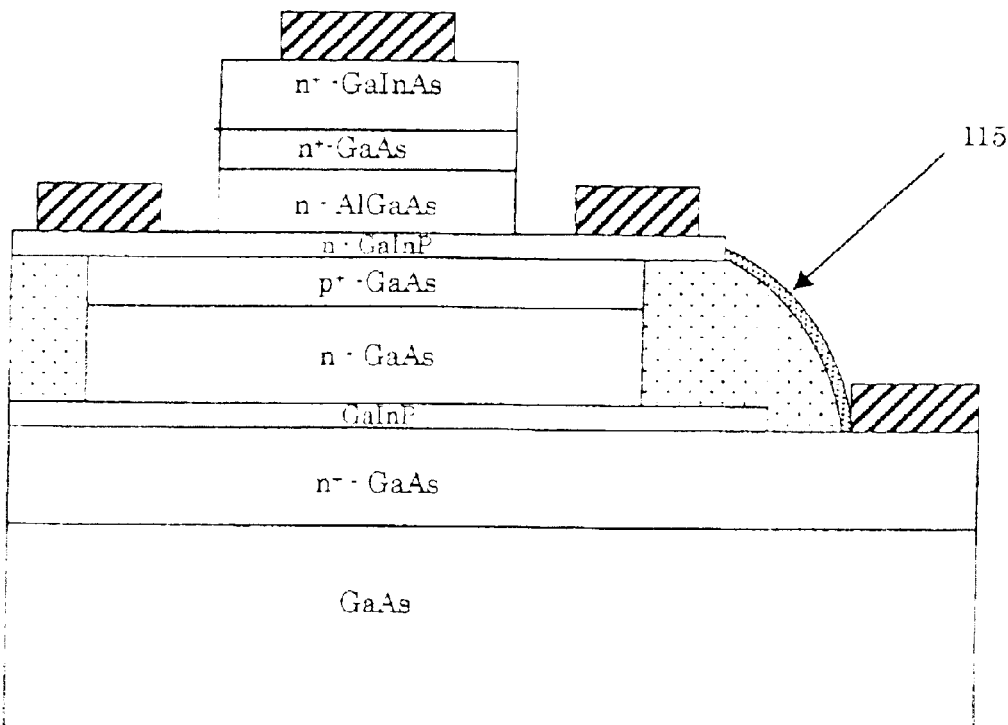

This heterojunction bipolar transistor can be formed by the following process:

As shown in FIG. 2(a), on a semi-insulative GaAs substrate 101, an n$^+$-type GaAs sub-collector layer 102 (thickness: 500 nm, Si doping concentration: $5 \times 10^{18}$ cm$^{-3}$), an n$^+$-type GaInP etching stopper layer 103 (thickness: 20 nm, Si doping concentration: $3 \times 10^{18}$ cm$^{-3}$), an n-type GaAs collector layer 104 (thickness: 700 nm, Si doping concentration: $3 \times 10^{16}$ cm$^{-3}$), a p$^+$-type GaAs base layer 105 (thickness: 70 nm, C doping concentration: $4 \times 10^{19}$ cm$^{-3}$), an n-type GaInP semiconductor protecting layer 106 (thickness: 25 nm, Si doping concentration: $5 \times 10^{17}$ cm$^{-3}$), an n-type AlGaAs emitter layer 107 (thickness: 100 nm, Si doping concentration: $5 \times 10^{17}$ cm$^{-3}$), an n$^+$-type GaAs first emitter contact layer 108 (thickness: 50 nm, Si doping concentration: $5 \times 10^{18}$ cm$^{-3}$) and an n$^+$-type GaInAs second emitter contact layer 109 (thickness: 100 nm, Si doping concentration: $1 \times 10^{19}$ cm$^{-3}$) are sequentially grown epitaxially by MOVPE method.

Next, as shown in FIG. 2(b), the second emitter contact layer 109, the first emitter contact layer 108 and the emitter layer 107 are removed by wet etching with an emitter formation layer left, i.e., except for a region where the emitter is to be formed, so as to form an emitter mesa. A mixture solution of citric acid:hydrogen peroxide:water= 10:1:10 is used as an etchant.

Subsequently, as shown in FIG. 2(c), an emitter electrode 111 and a base electrode 112 are formed on the second emitter contact layer 109 and on the semiconductor protecting layer 106, respectively, sequentially by a photolithography method and a lift-off method. The emitter electrode 111 is formed by forming a laminate film of tungsten nitride (WN) of 100 nm thickness, titanium (Ti) of 50 nm thickness, platinum (Pt) of 50 nm thickness and gold (Au) of 100 nm thickness on the second emitter contact layer 109. The base electrode 112 is formed by forming a laminate film of Pt of 20 nm thickness, Ti of 50 nm thickness, Pt of 50 nm thickness and Au of 100 nm thickness on the semiconductor protecting film 106.

Subsequently, as shown in FIG. 2(d), the semiconductor protecting layer 106 is masked for forming a base mesa. At this time, the base electrode 112 is entirely masked. Thereafter, the semiconductor protecting layer 106 is etched away with hydrochloric acid, and the base layer 105 and the collector layer 104 are etched away with the same citric acid base etchant as used for forming the emitter mesa, in such a manner that the surface of the etching stopper layer 103 is exposed and the side faces of the base layer 105 and the collector layer 104 become inside the outside edge of the layer on which the base electrode 112 is formed.

Subsequently, as shown in FIG. 2(e), the resulting substrate is covered with photoresist 116 at least with exception of a region in which a collector electrode 113 is to be formed. At this time, particularly the semiconductor protecting layer 106 is not exposed. The etching stopper layer 103 is removed using hydrochloric acid.

Thereafter, as shown in FIG. 2(f), a laminate film of AuGe of 100 nm thickness, Ni of 15 nm thickness and Au of 100 nm thickness is formed, and made into the collector electrode 113 by a photolithography method and a lift-off method. At this time, the surface and side faces of the each semiconductor layer may be covered with an inorganic insulating film such as nitride silicon.

Subsequently, as shown in FIG. 2(g), a positive-type photosensitive polyimide precursor diluted with a solvent is applied onto the resulting substrate 101 so that it covers side faces of the base layer 105 and the collector layer 104 which are formed inside the semiconductor protecting film 106 by side etching. The thickness of the polyimide precursor is so adjusted that, after thermal treatment, its surface is at the same level as or above the surface of the semiconductor protecting film 106 and below the surface of the base electrode 112.

As shown in FIG. 2(h), the polyimide precursor is exposed and developed. Since the polyimide precursor has positive photosensitivity, the polyimide precursor can be removed from an exposed region by development and left in an unexposed region including a region under the semiconductor protecting layer 106 which light has not reached. Thereafter the polyimide precursor is imidized by the thermal treatment to form an organic insulator 114 of polyimide in a void under the semiconductor protecting layer 106.

Subsequently, as shown in FIG. 2(i), the surface of the polyimide resin is covered with an inorganic insulating film 115 of silicon nitride of 100 nm thickness. Thus the heterojunction bipolar transistor 100 is completed.

In the heterojunction bipolar transistor 100 of the present invention, the base electrode 112 is formed on the semiconductor protecting layer 106 whose area is larger than the base layer 105, the base electrode 112 extending outside the base layer 105. Thereby, it is unnecessary to hold all the layers for forming the base electrode 112 on the base 105, and as compared with the case where the base electrode is formed directly on the base layer 105, the size of the base layer can be reduced. Thereby, the parasitic collector capacitance can be reduced, and the maximum oscillated frequency $f_{max}$ can be improved.

The semiconductor protecting layer 106 itself on which the metal thin films are formed is very thin, i.e., about 20 to 50 nm thick, and is very fragile to mechanical, thermal external force. However, the organic insulator 114 of polyimide is filled under the semiconductor protecting layer 106, and therefore, it is possible to improve the mechanical strength of the semiconductor protecting layer 106 and to prevent the base electrode and a lead metal from breaking owing to difference in thermal stress between the metal films and the semiconductor layer. Thus the tolerance of the heterojunction bipolar transistor to a temperature cycling test can be improved.

Moreover, since the organic insulator 114 is formed by use of the diluted polyimide precursor, the organic insulator 114 can be easily and surely formed immediately beneath the semiconductor protecting layer 106 which forms an overhang. Therefore, the base electrode 112 can be connected smoothly with the lead electrode, and as a result, the yield of transistor production is improved.

Furthermore, the side faces of the collector layer 104 and the base layer 105 and the surface and the side face of the etching stopper layer 103 are packed with the organic insulator 114 such as polyimide or the like. Therefore, hydrogen can be prevented from being taken into the semiconductor layer unlike the case where they are covered with an inorganic insulating film. The characteristics of the device can be thus stabilized.

Also, by covering the surface of the organic insulator 114 with the inorganic insulating film 115, it is possible to prevent the occurrence of failure caused by breaks between the base electrode and its lead metal even in a steam pressure test at 120° C. and 2 atmospheric pressure.

Further, the surface of the p$^+$-type base layer 105 is all covered with the semiconductor protecting layer 106, a base-collector junction area agrees with the area of base layer 105 and the collector layer 104, and a junction interface of the base layer 105 on a collector layer 104 side is not exposed. Therefore, the generation of recombination current on the surface of the base layer 105 can be suppressed, and the reliability of the device during the device is energized can be improved.

Also, the base layer 105 and the collector layer 104 are formed of the same material, i.e., GaAs, and do not have any other semiconductor layer at their interface. Therefore, there is no barrier against electron transport and the intrinsic collector capacitance does not increase. Thus the maximum oscillated frequency can be improved.

As shown in FIG. 2(f), by covering the semiconductor protecting layer 106 with the photoresist when the etching stopper layer 103 under the collector layer 104 is removed, it is possible to avoid damage on the semiconductor protecting layer 106 and the base electrode 112 formed thereon by hydrochloric acid and to improve the yield in the device production.

EXAMPLE 2

Figure 3:
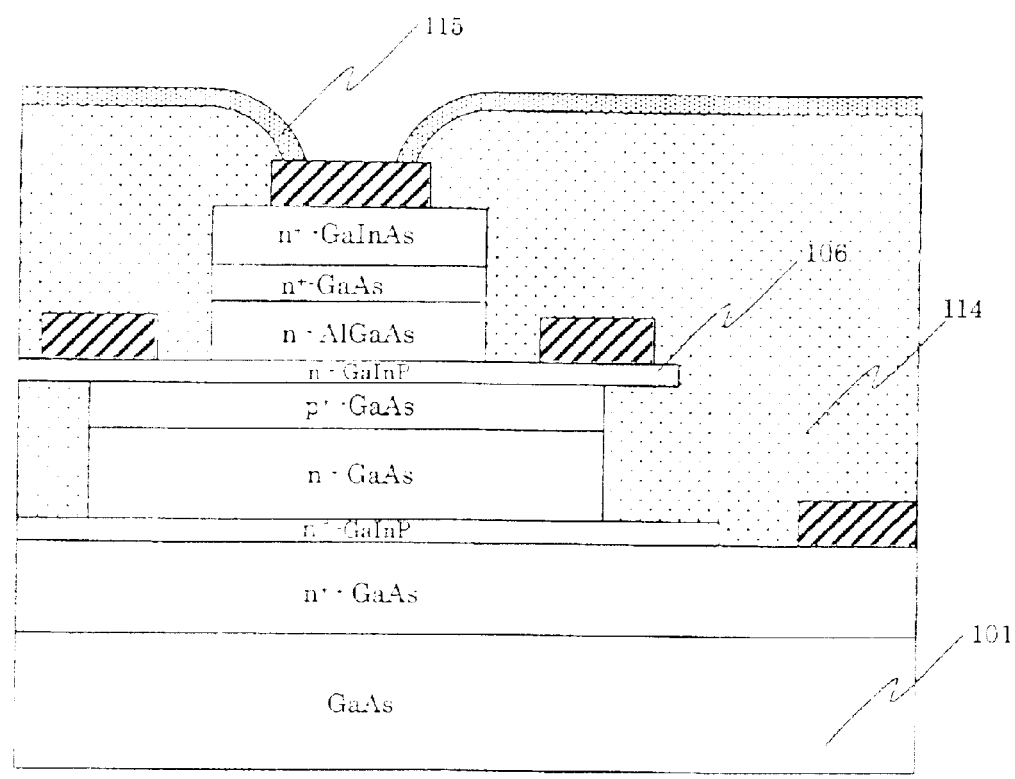
FIG. 3 is a schematic sectional view of a major part of a heterojunction bipolar transistor in accordance with another example of the present invention.

As shown in FIG. 3, the heterojunction bipolar transistor of this example is substantially the same as that of Example 1 except that the organic insulator 114 of the polyimide resin is formed not only under the semiconductor protecting layer 106 but also over the entire heterojunction bipolar transistor.

Figure 4:
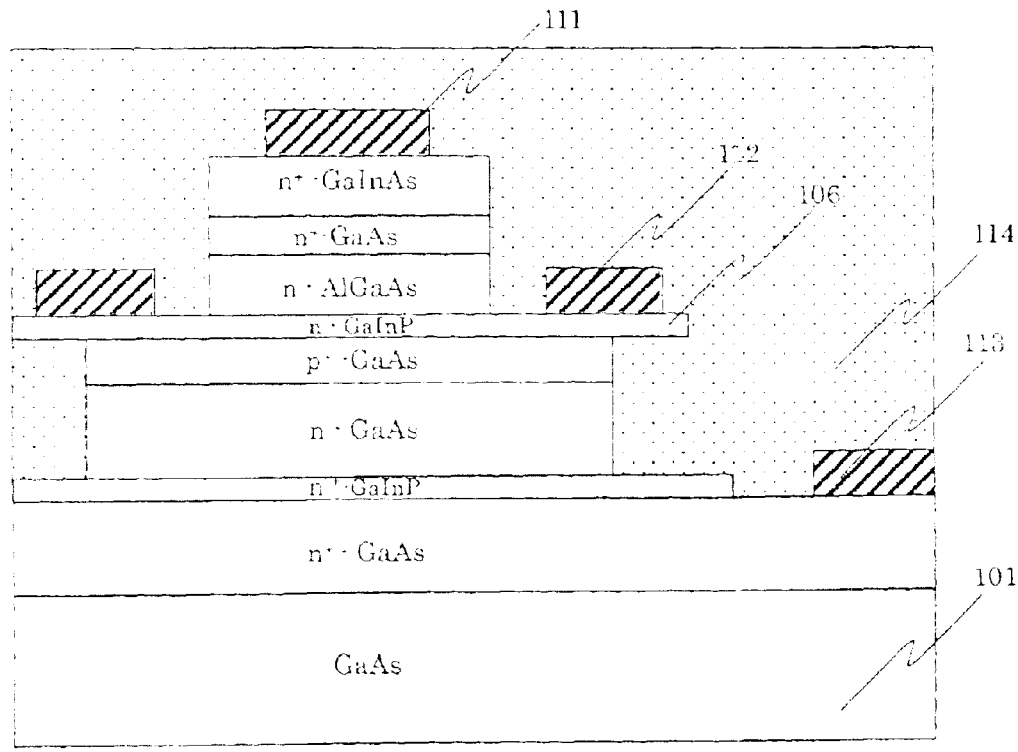
FIGS. 4(a) and 4(b) are schematic sectional views of the major part of the heterojunction bipolar transistor of FIG. 3, illustrating a process for producing the same.
Figure 4:
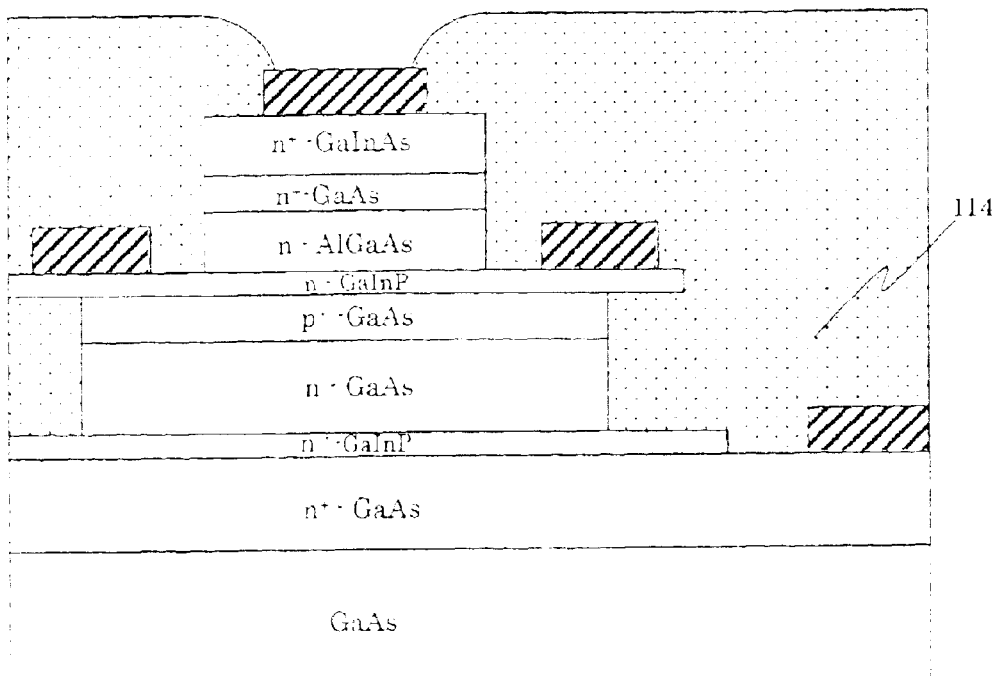

As in Example 1, such a heterojunction bipolar transistor is formed by, after the formation of the layers and the electrodes (see FIG. 2(a) to FIG. 2(f)), applying the positive-type photosensitive polyimide precursor diluted with a solvent to the resulting substrate 101 to cover the layers and the electrodes completely as shown in FIG. 4(a).

Subsequently, as shown in FIG. 4(b), for connecting metal wiring to the emitter electrode 111, the base electrode 112 or the collector electrode 113, the polyimide precursor on these electrodes is partially removed by exposure and development. Thereafter, the surface of the polyimide resin is covered with the inorganic insulating film 115 as in Example 1, to complete the heterojunction bipolar transistor of FIG. 3.

According to the present invention, the semiconductor protecting layer of the first conductivity type whose area is larger than that of the base layer is formed on the base layer, the base electrode is formed on the semiconductor protecting layer, and the side faces of the base layer and the collector layer under the semiconductor protecting layer are packed with the organic insulator. Therefore, it is possible to reduce the size of the base layer, to reduce the parasitic collector capacity and to improve the maximum oscillated frequency. Moreover, since the semiconductor protecting layer is prevented from partial physical breakage and the side faces of the base layer and the collector layer are completely covered with the organic insulator, the reliability of the device can be greatly improved.

Particularly, in the case where the semiconductor protecting layer has a thickness of 20 nm to 50 nm and a part of the base electrode is extended outside the base layer above the base layer, the size of the base layer can be reduced and the parasitic collector capacitance can be reduced further.

Also, according to the production process of the present invention, while reducing the junction resistance of the collector electrode, the etching stopper layer can be removed without affecting the semiconductor protecting layer and the base electrode. Therefore, the surface of each layer can be prevented from being damaged, and the heterojunction bipolar transistor can be produced which has more excellent high-frequency characteristics.

What is claimed is:

1. A heterojunction bipolar transistor comprising a collector layer of a first conductivity type, a base layer of a second conductivity type, and an emitter layer of the first conductivity type, which are formed on a semiconductor substrate in this order, and further a collector electrode directly or indirectly connected to the collector layer, a base electrode directly or indirectly connected to the base layer, and an emitter electrode directly or indirectly connected to the emitter layer, wherein a semiconductor protecting layer is formed between the base layer and the emitter layer and is extended outside an edge of the base layer, wherein said semiconductor protecting layer is of the first conductivity type, the base electrode is formed on the semiconductor protecting layer, and at least a region under the semiconductor protecting layer is filled with an organic insulator.

2. A heterojunction bipolar transistor according to claim 1, wherein a bottom face of the semiconductor protecting layer and side faces of the base layer and the collector layer are covered with the organic insulator.

3. A heterojunction bipolar transistor according to claim 1 or 2, wherein the collector layer and the base layer comprise GaAs, the emitter layer comprises GaAs or AlGaAs, and the semiconductor protecting layer comprises GaInP.

4. A heterojunction bipolar transistor according to claim 1, wherein the semiconductor protecting layer has a thickness of 20 nm to 50 nm, and a part of the base electrode extends outside an edge of the base layer.

5. A heterojunction bipolar transistor according to claim 1, further comprising a sub-collector layer of the first conductivity type between the semiconductor substrate and the collector layer, the sub-collector layer having a higher carrier concentration and a larger area than the collector layer, and an etching stopper layer between the collector layer and the sub-collector layer, the etching stopper layer having an area larger than the collector layer and smaller than the sub-collector layer.

6. A heterojunction bipolar transistor according to claim 5, wherein the sub-collector layer comprises GaAs and the etching stopper layer comprises GaInP.

7. A heterojunction bipolar transistor according to claim 1, wherein the organic insulator comprises a polyimide resin.

8. A heterojunction bipolar transistor according to claim 7, wherein the polyimide resin has a positive-type photosensitivity.

9. A heterojunction bipolar transistor according to claim 1, wherein a surface of the organic insulator is covered with an inorganic insulating film.

* * * * *